US007830233B2

(12) United States Patent
Hrkac

(10) Patent No.: US 7,830,233 B2
(45) Date of Patent: Nov. 9, 2010

(54) ELECTRICAL INDUCTION DEVICE FOR HIGH-VOLTAGE APPLICATIONS

(75) Inventor: Miljenko Hrkac, Monselice (IT)

(73) Assignee: ABB Technology AG, Zurich (CH)

( * ) Notice: Subject to any disclaimer, the term of this patent is extended or adjusted under 35 U.S.C. 154(b) by 507 days.

(21) Appl. No.: 11/794,202

(22) PCT Filed: Dec. 27, 2004

(86) PCT No.: PCT/EP2004/014813

§ 371 (c)(1), (2), (4) Date: Jun. 26, 2007

(87) PCT Pub. No.: WO2006/069590

PCT Pub. Date: Jul. 6, 2006

(65) Prior Publication Data

US 2008/0211617 A1 Sep. 4, 2008

(51) Int. Cl.

| | |
|---|---|
| ***H01F 27/30*** | (2006.01) |
| ***H01F 27/10*** | (2006.01) |
| ***H01F 27/08*** | (2006.01) |
| ***H01F 21/04*** | (2006.01) |
| ***H01F 27/28*** | (2006.01) |
| ***H05K 7/14*** | (2006.01) |

(52) U.S. Cl. .......................... 336/196; 336/58; 336/60; 336/92; 336/128; 336/170; 336/184; 336/185; 336/199; 174/535

(58) Field of Classification Search ...................... None
See application file for complete search history.

(56) References Cited

U.S. PATENT DOCUMENTS 1,367,988 A * 2/1921 Replogle .................... 336/92
1,690,353 A * 11/1928 Wilson et al. ............... 174/535
2,247,655 A * 7/1941 Fields ........................ 336/40
3,119,085 A * 1/1964 Tiejema ...................... 336/96
3,264,590 A * 8/1966 Trench ....................... 336/60
3,302,149 A * 1/1967 Forsha ........................ 336/58
3,772,627 A * 11/1973 Wilk et al. .................. 336/197
3,773,627 A * 11/1973 Weber et al. ................... 203/2
3,775,719 A * 11/1973 Gainer et al. ................. 336/58

(Continued)

OTHER PUBLICATIONS

PCT/ISA/210.

(Continued)

*Primary Examiner*—Elvin G Enad
*Assistant Examiner*—Mangtin Lian
(74) *Attorney, Agent, or Firm*—Buchanan Ingersoll & Rooney PC

(57) ABSTRACT

An electrical induction device for high voltage applications, of the type comprising a magnetic core which has at least one leg and is operatively coupled to a supporting structure, at least one inner winding which is arranged around said leg and has a first rated voltage, at least one outer winding which is arranged around said at least one inner winding and has a second rated voltage; and electrically insulating means, wherein said at least one inner winding comprises a plurality of substantially concentric turns formed by a sheet of electrically conducting material which is spirally wound, and in that said electrically insulating means comprise at least one layer of electrically insulating material which is arranged between mutually facing surfaces of said concentric turns, and first shaped insulating means which edge, at least partially, at least one of the upper and lower external rims of said inner winding.

15 Claims, 3 Drawing Sheets

U.S. PATENT DOCUMENTS 3,789,337 A * 1/1974 Sheppard ..................... 336/60
4,009,461 A * 2/1977 Usry .......................... 336/197
4,219,791 A * 8/1980 Moore et al. .................. 336/58
5,461,772 A * 10/1995 Puri ............................ 29/605
6,147,580 A * 11/2000 Rettew et al. ................. 336/60
6,806,803 B2 * 10/2004 Hopkinson et al. ............ 336/67
7,242,275 B2 * 7/2007 Poniatowski et al. ........ 336/226
2002/0186113 A1 * 12/2002 Hjortstam et al. ............. 336/55
2004/0257188 A1 12/2004 Younger et al.

OTHER PUBLICATIONS

PCT/ISA/237.

* cited by examiner

ELECTRICAL INDUCTION DEVICE FOR HIGH-VOLTAGE APPLICATIONS

The present invention relates to an electrical induction device for high voltage applications, in particular an industrial power transformer, having improved performances and an optimised structure.

It is widely known in the art the use of electrical induction devices, such as reactors or transformers, which exploit the electromagnetic induction for properly transmitting and distributing electricity over power lines.

In particular, the basic task of a power transformer is to allow exchanging electric energy between two or more electrical systems of usually different voltages. Most common power transformers generally comprise a magnetic core composed by one or more legs or limbs connected by yokes which together form one or more core windows; for each phase, around the legs there are arranged a number of windings, i.e. low-voltage windings, high-voltage windings, control or regulation windings. The phase windings are usually realized by winding around the corresponding leg of the core suitable conductors, for example wires, or cables, or strips, so as to achieve the desired number of turns; typical constructive configurations are for example the so-called multilayer or disc configurations, wherein the conductors are wound around a cylindrical tube which represents an optimal configuration as regard to filling the area available with useful material and providing also the maximum short circuit strength.

Due to the intrinsic structural characteristics and functioning of these devices, a very important aspect concerns the electrical insulation which must be guaranteed among the various elements in order to provide the desired electromagnetic performance without incurring in any malfunctioning or damages, and meet at the same time international standards and regulations; in fact, when these devices are in operations, there may be a significant difference of voltage among the various parts, for example between the low and high voltage windings, among the turns of each single winding, or among the windings/turns and other live/conducting parts such as the tie-rods or clamps of the structure which is used to support mechanically the electromagnetic equipment. Hence, the various components should be arranged with a relative distance determined by the dielectric stress which may be allowed to occur, which requirement is obtained in most cases by adopting particularly devised insulating systems and/or by using suitable conductors or configurations for the windings.

Such requirements become more demanding and severe to be satisfied when increasing the performance required, for example with induction devices of the type of the present invention, which are called to provide power of the order of several tens MVA and have phase windings rated in the range from few kV up to more 100 kV.

At the current state of the art, although the solutions adopted allow achieving appreciable results, there are still some aspects which can be optimised and technically improved, in particular as regard to the construction of the phase windings and the layout of the electrical insulation, which have a decisive impact over the whole costs and performance of these devices.

The same considerations apply to a certain extent in most types of reactors which are basically required to compensate possible variations of tension over the lines and deal more or less with the same requirements and problems of power transformers.

Hence, the aim of the present invention is to provide an electrical induction device for high voltage applications, and in particular an industrial power transformer, whose constructive structure is optimized with respect to equivalent types of known induction devices, and in particular which allows optimising the manufacturing costs in comparison with known devices having the same or comparable power ratings, while assuring the needed safety and reliability in operations.

This aim is achieved by an electrical induction device for high voltage applications, of the type comprising:

a magnetic core having at least one leg and operatively coupled to a supporting structure;

at least one inner winding which is arranged around said leg and has a first rated voltage;

at least one outer winding which is arranged around said at least one inner winding and has a second rated voltage; and electrically insulating means; characterized in that said at least one inner winding comprises a plurality of substantially concentric turns formed by a sheet of electrically conducting material which is spirally wound, and in that said electrically insulating means comprise at least one layer of electrically insulating material which is arranged between mutually facing surfaces of said concentric turns, and first shaped insulating means which edge, at least partially, at least one of the upper and lower external rims of said inner winding.

Further characteristics and advantages of the present invention will become apparent from the description of some embodiments of the subject electrical induction device which will be described by making reference to a preferred embodiment as a three-phase industrial power transformer, without intending to limit in any way its possible field of application, and illustrated only by way of non-limitative examples in the accompanying drawings, wherein.

Figure 1:
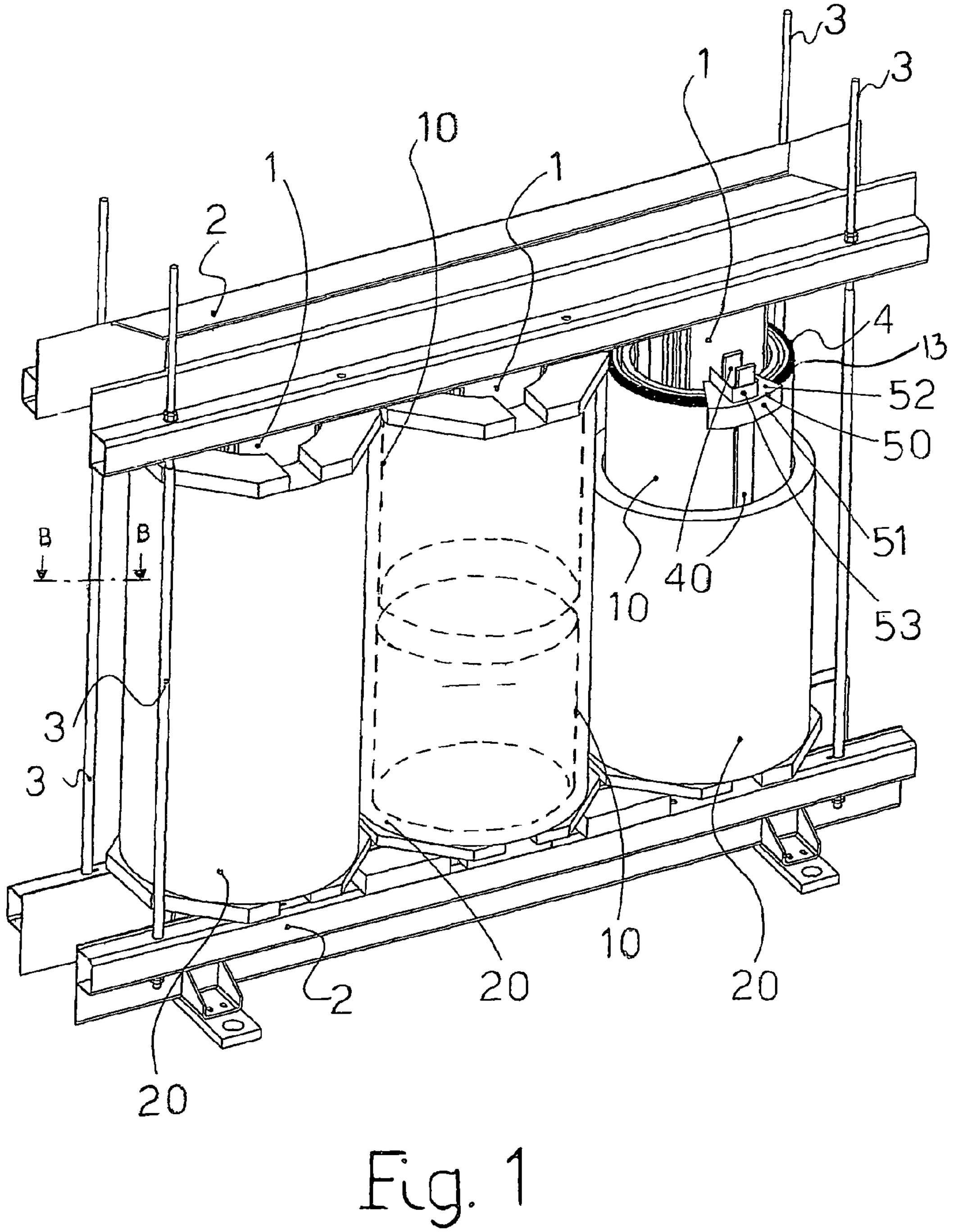
FIG. 1 is perspective view of a three-phase power transformer according to the present invention.

With reference to the above cited figures, the high-voltage induction device according to the invention comprises a magnetic core which is operatively coupled to a supporting structure and has at least one leg 1; in particular, in the embodiment of FIG. 1, the magnetic core comprises one leg 1 for each phase, namely three, with the legs 1 mutually connected by yokes (not visible in the figures) according to constructive configurations which are well known in the art and therefore will not be described herein in details. In turn, the supporting structure comprises a couple of clamps 2 which are positioned on the opposite sides of the core and are connected by one or more vertical connecting elements 3, typically tie-rods.

As shown in FIG. 1, around a leg 1 there is arranged at least one inner winding 10 which has a first rated voltage, and at least one outer winding 20 which is arranged around the inner winding 10 and has a second rated voltage, preferably higher than said first rated voltage; for example, the rated voltage of the inner winding 10 can be 36 kV, while the rated voltage of the outer winding 20 can be 170 kV. Although international standards generally define the field of low-voltage applications as that with voltage levels up to 1 kV, and the field of high-voltage application the one with voltage levels above 1 kV, in the technical field of induction devices of the type of the present invention, the outer winding 20 is normally indicated as the high-voltage-winding, whilst the inner winding 10 is usually indicated as the low-voltage winding (in some cases also as the medium-voltage winding), and these definitions will be used in the following description.

The induction device further comprises insulating means for providing electrical insulation among its living\conducting parts, in the embodiments and for the purposes that will be described in details hereinafter.

Figure 2:
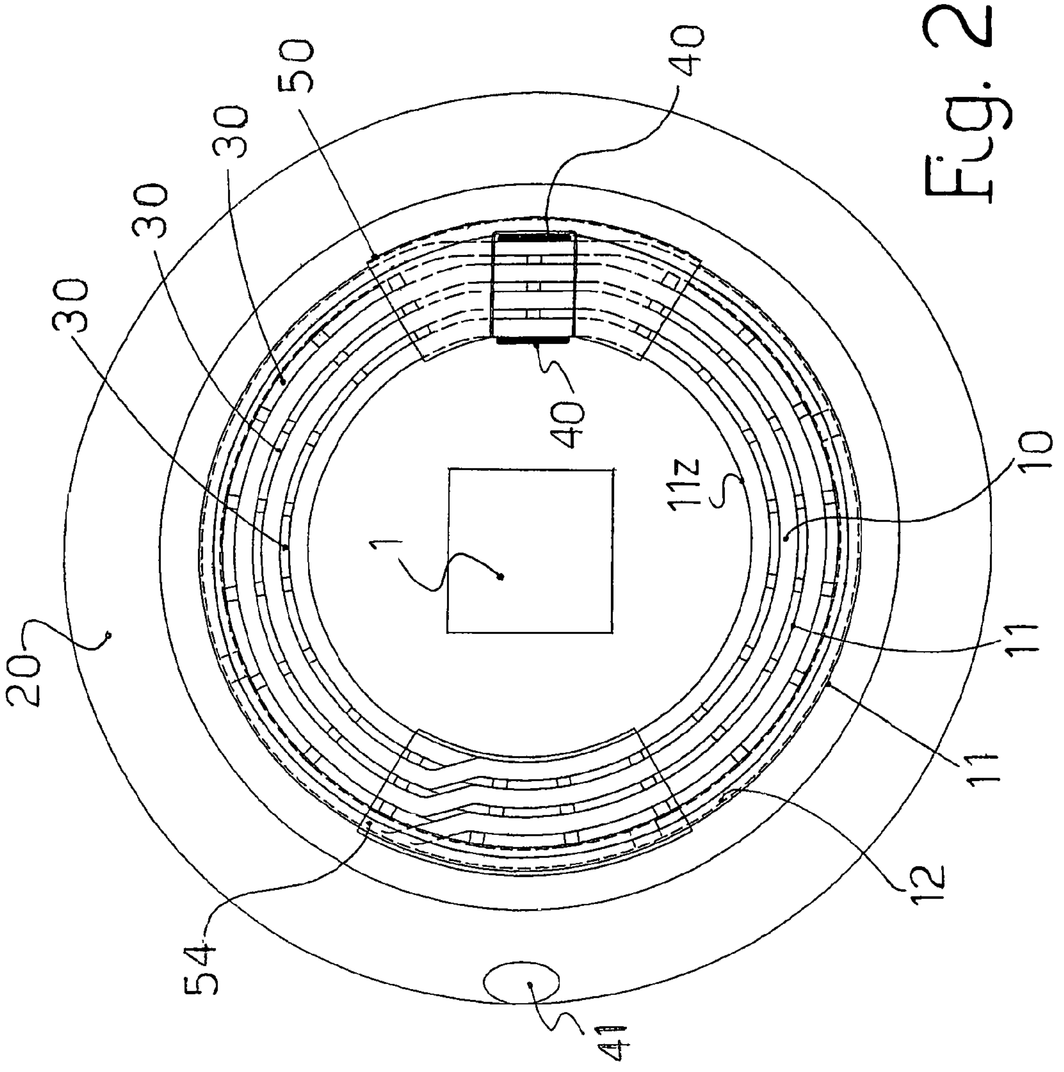
FIG. 2 is a top plan view schematically showing the inner and outer phase windings of the transformer of FIG. 1.

Advantageously, as schematically illustrated in FIG. 2, the inner winding 10 comprises a plurality of substantially concentric turns 11 which are built-up by a sheet of electrically conducting material, for example copper or aluminium, which is spirally wound; preferably, the conducting sheet is formed by a single piece which is continuously wound around a tubular element (not shown in the figures) in such a way that the winding 10 has a whole cylindrical configuration, as illustrated in FIG. 1. The inner winding 10 further comprises a plurality of through channels 30 which are provided along various circumferences at different radial distances from the leg 1, and inside which a cooling fluid flows, for example a mineral oil; in particular, each channel 30 extends between two adjacent turns 11 and for the whole vertical length of the turns 11 themselves, substantially parallel to the leg 1; finally, as illustrated in FIG. 1, in correspondence of the first internal turn 11*z* and of the last external turn 11*a*, there are provided two corresponding electrical conducting elements 40, for example bars, which are connected to and protrude from the inner winding 10 so as to allows its operative connection to other components of the device, for example, insulators, other windings, et cetera.

Figure 3:
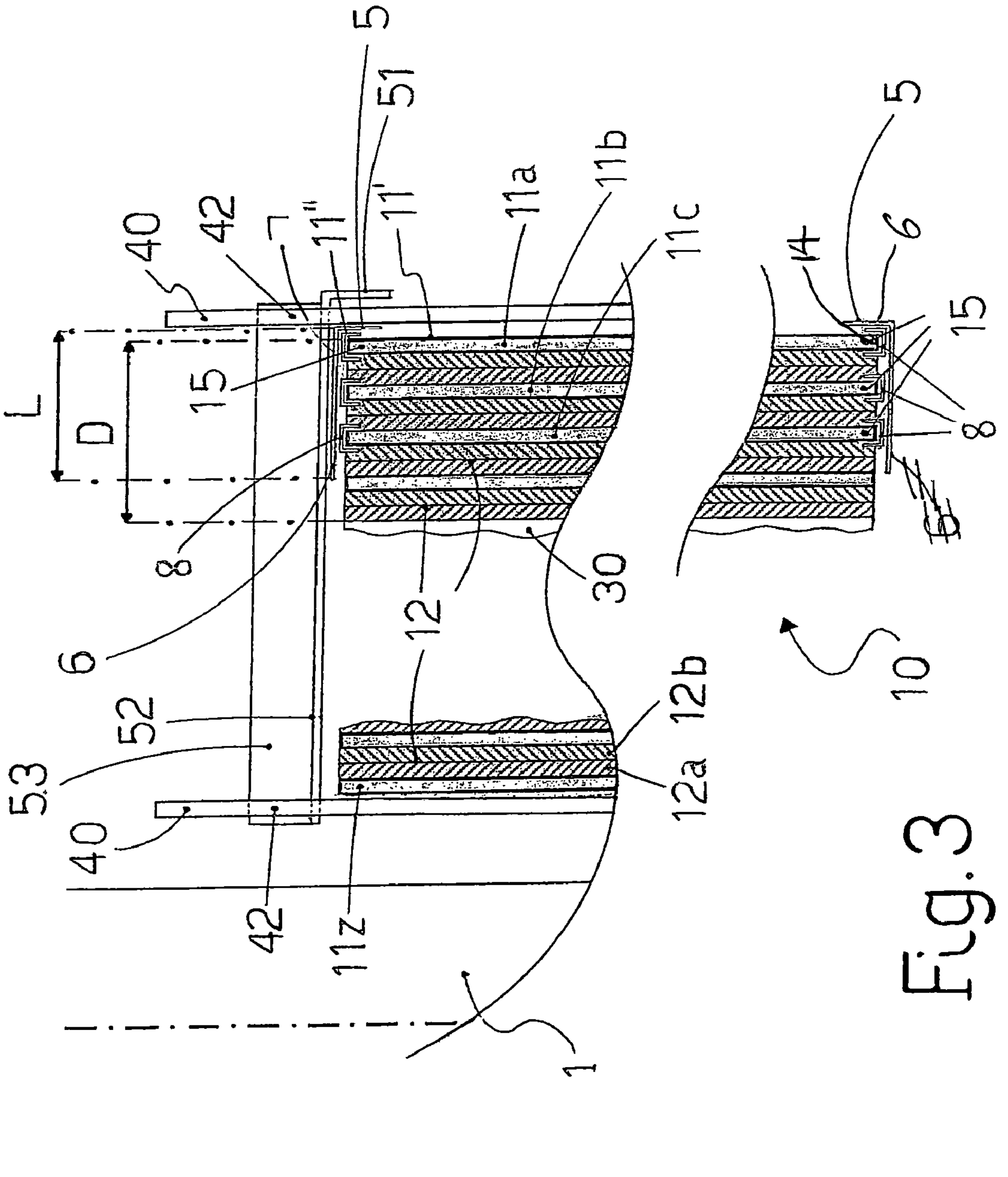
FIG. 3 is a lateral cross-section schematically illustrating the inner winding coupled to electrically insulating means according to a preferred embodiment of the device according to the invention.

Advantageously, as evidenced in FIG. 3, the electrically insulating means comprise at least one layer 12 of electrically insulating material which is arranged between mutually facing surfaces of consecutive turns 11, and first shaped insulating means which edge, at least partially, at least one of the upper 13 and lower 14 external rims of the inner winding 10. Preferably, the layer 12 comprises at least one sheet of cellulose-based material—for example the so-called DDP or diamond-dot-paper, or other insulating means like polyester-based material—which is also spirally wound together with the conductive sheet; according to a particularly preferred embodiment illustrated in FIG. 3, the layer 12 comprises two separate sheets 12*a*, 12*b*, of cellulose-based material mutually attached to each other and each facing a corresponding surface of a turn 11. In this way, the layer 12 provides an appropriate electrical insulation between each couple of consecutive turns, and the likelihood of electrical discharges between the turns due to possible gaps in the insulating layer itself is drastically reduced by adopting two distinct and mutually attached sheets. Preferably, the sheets 12*a*, 12*b* can be adhered, at least partially to the surfaces of the turns 11, thus contributing to increase the structural stiffness of the whole inner winding 10.

In turn, as shown in FIGS. 1 and 3, the first shaped insulating means comprise a first shaped body 4 and a second shaped body 5 which are preferably in the form of angular sectors with an L-shaped side cross-section and are operatively connected, for example by glueing, to the upper external rim 13 and the lower external rim 14 of the winding 10, respectively; as illustrated in detail in FIG. 3, the shaped bodies 4 and 5 are positioned with a first side 6 which is positioned substantially parallel to the leg 1 and covers a portion of the outer surface 11' of the last external turn 11*a*, and a second side 7 which is positioned substantially perpendicular to the leg 1 and covers the corresponding short side 11" of at least the last external turn 11*a*. Preferably, the second side 7 of the first and second angular-shaped bodies 4, 5 has a length L which is shorter than the distance D between the outer surface 11' of the last external turn 11*a* and the external wall of the most external through channel 30 (with respect to the leg 1). In this way, when the bodies 4,5 are coupled to the winding 10, the channels 30 remain uncovered.

Advantageously, the first shaped insulating means further comprise at least one U-shaped body 8 which is positioned under the corresponding angular-shaped body 4 or 5, and wraps at least one of the upper or lower tip portions 15 of at least the last external turn 11*a*, at least for a part of its whole circumference. Preferably, in the device according to the invention there are provided a first U-shaped body 8 and a second U-shaped body 8 which wrap the upper and lower tip portions 15 of the last external turn 11*a*, respectively; more preferably, there are also provided a third U-shaped body 8 and a fourth U-shaped body wrapping the upper and lower tip portions 15 of the penultimate external turn 11*b*, respectively, at least for a part of its whole circumference. According to a particularly preferred embodiment, the first shaped insulating means comprise also a fifth U-shaped body 8 and a sixth U-shaped body wrapping, the upper and lower tip portions 15 of the ante-penultimate external turn 11*c*, respectively, for at least part of its circumference. The various U-shaped bodies 8 can be realized by a single piece of insulating material, e.g. cellulose-based material such as crepe-paper, pressboard or other suitable materials; each U-shaped body 8 is directly positioned around and embraces the corresponding tip portion 15 for the entire circumference of the respective turn 11*a*, 11*b*, 11*c*. Alternatively, such U-shaped bodies 8 can be realized in several portions each wrapping a respective part of the corresponding tip portion 15.

In the induction device according to the invention, the electrically insulating means preferably comprise also second shaped insulating means which are operatively coupled to and arranged around a portion of at least one of the electrical conducting elements 40 which are connected to and protrudes from the inner winding 10. Advantageously, as illustrated in FIGS. 1 and 3, said second shaped insulating means comprise a first contoured body 50 having a first L-shaped portion which is operatively coupled to the inner winding 10—over the U-shaped bodies 8 and the L-shaped body 4—with a first side 51 positioned substantially parallel to the leg 1 and a second side 52 positioned substantially perpendicular to the leg 1; further, the contoured body 50 comprises a second U-shaped portion 53 which is integral with and rises from the second side 52, substantially parallel to the leg 1. The U-shaped portion 53 surrounds, like a collar, at least partially, the portion 42 of the conducting elements 40 protruding from the inner winding 10. In this way, the body 50, thanks to its particular configuration, allows improving the electrical field distribution and hence the dielectric strength between the elements 40 and the outer high-voltage winding 20.

Preferably, the second shaped insulating means further comprise a second contoured body, indicated by the reference number 54 in FIG. 2, which is positioned at the upper portion of the inner winding 10, preferably substantially opposite to the first contoured body 50 with respect to the leg 1, so as to cover a region of the winding 10 which faces the winding legs of the outer winding 20, schematically indicated by the reference number 41 in FIG. 2. The second body 54 is preferably in the form of an angular sector with an L-shaped side cross-section, similar to the first L-shaped portion of the contoured body 50; the second body 54 is positioned over the first angular body 4 and the U-shaped bodies 8, with a first side which is positioned substantially parallel to the leg 1 and covers a portion of the outer surface 11' of the last external turn 11*a*, and a second side which is positioned substantially perpendicular to said leg 1 and preferably extends up to the most internal turn 11*z*, as schematically shown in FIG. 2.

According to a particularly preferred embodiment, the electrically insulating means comprise third shaped insulating means which are arranged around at least a portion of at least one tie-rod 3; preferably, the third shaped insulating means are arranged around all tie-rods 3 and for their whole length comprised between the clamps 2.

Figure 4:
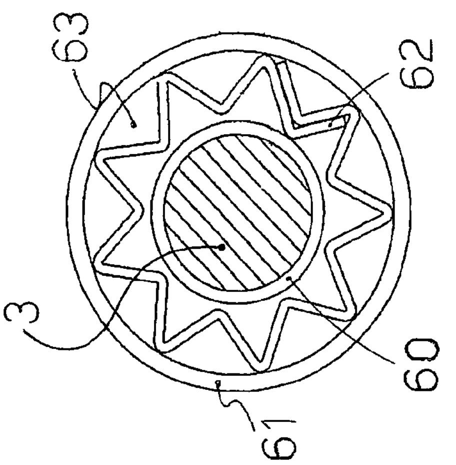
FIG. 4 is a cross section taken along the plane B-B of FIG. 1, illustrating a tie-rod coupled to electrically insulating means according to a preferred embodiment of the device according to the invention.

Advantageously, as illustrated in FIG. 4, the third shaped insulating means comprise a first layer 60 and a second layer 61 of cellulose-based material which are tubularly wound around a corresponding tie-rod 3 spaced apart from each other, and a third element 62 made of insulating material which is arranged therebetween; preferably, the first layer 60 comprises a sheet of crepe-paper having a thickness ranging between 0.8 and 1.2 mm which is placed directly around the tie-rod 3; the second layer 61 comprise a sheet of crepe-paper having a thickness ranging between 1 and 3 mm which is placed spaced from the first layer 60 so as to define a channel 63 therebetween; in turn, the third element 62 is realized by a suitably contoured body, for example made of cellulose based material or wood, which is positioned inside the channel 62 and mutually spaces out said first and second layers 61 and 62.

In this way, a further improved insulation is provided between the tie-rods 3 and the outer winding 20, with also the possibility of cooling, for example by means of a suitable oil flowing inside the channel.

In practice, it has been found that the electrical induction device according to the invention fully achieves the intended aim giving some significant advantages and improvements with respect to known induction devices. In fact, among the others, thanks to the purposive construction of the inner winding 10 and the described layout of the electrically insulating means adopted, the manufacturing costs can be reduced of a substantial amount with respect to known types of devices with inner windings of more conventional construction, while the dielectric characteristics among the various parts are substantially improved, according to a solution which is extremely simple in construction and functionally effective; thus, it follows that the device of the present invention is cheaper with respect to known devices of same ratings and performances, or it has improved performances, in particular as regards to the power rating which is of the order or several MVA when compared to known device of similar cost. The electrical induction device thus conceived is susceptible of numerous modifications and variations, all of which are within the scope of the inventive concept as defined in the claims; for example, for each phase there might be provided two inner low-voltage windings 10 which are positioned around the corresponding phase leg 1 spaced apart from and operatively coupled to each other, with the outer winding 20 placed around them, as illustrated in dotted lines only for the central phase in FIG. 1. In this case the second inner winding 10 has exactly the same construction as the one previously described with two corresponding bodies 4 and 5 covering its external rims, and corresponding U-shaped bodies 8 embracing the relative tip portions of only its last turn, or preferably of its last two turns, or more preferably of its last three turns. Likewise, at the external end of the second winding 10 (the lowest end in FIG. 1), there are arranged relative bodies 50 and 54 in the same configuration and for the same purposes as above described. In turn, there could be only one outer winding 20 (or two or even several) which is built-up according to a more conventional construction, namely by means or cable, or wires, or strip arranged in a disc- or a multilayer-configuration.

Finally, all the details may furthermore be replaced with other technically equivalent elements, and the materials and dimensions may be any according to requirements and to the state of the art, provided they are compatible with the scope of and functioning in the application.

The invention claimed is:

1. An electrical induction device for high voltage applications, comprising:

a magnetic core having at least one leg and operatively coupled to a supporting structure;

at least one inner winding which is arranged around said leg and has a first rated voltage;

at least one outer winding which is arranged around said at least one inner winding and has a second rated voltage; and electrically insulating means;

wherein said at least one inner winding comprises a plurality of substantially concentric turns formed by a sheet of electrically conducting material which is spirally wound, and wherein said electrically insulating means comprise at least one layer of electrically insulating material which is arranged between mutually facing surfaces of said concentric turns, and first shaped insulating means which covers, at least partially, at least one of the upper and lower external rims, and external wall, of said at least one inner winding wherein said first shaped insulating means comprise a first shaped body and a second shaped body having an L-shaped cross section, said first and second shaped bodies being connected to said upper and lower external rims, respectively, with a first side which is positioned substantially parallel to said leg and covers a portion of the outer surface of the last external turn, and a second side which is positioned substantially perpendicular to said leg and covers the corresponding short side of at least said last external turn; and wherein said at least one inner winding comprises a plurality of through channels each extending substantially parallel to said leg between two adjacent turns, the second side of said first and second shaped bodies having a length which is shorter than the distance between the outer surface of said last turn and the external wall of the most external through channel.

2. The electrical induction device according to claim 1 wherein said at least one inner winding has a first rated voltage which is lower than the second rated voltage of said outer winding.

3. The electrical induction device according to claim 1 wherein said first shaped insulating means comprise a U-shaped body which wraps, at least partially, at least one of the upper or lower tip portions of at least the last external turn.

4. The electrical induction device according to claim 3 wherein said first shaped insulating means comprise a first and a second U-shaped bodies wrapping, at least partially, the upper and lower tip portions of the last external turn, respectively.

5. The electrical induction device according to claim 4 wherein said first shaped insulating means comprise a third and a fourth U-shaped bodies wrapping, at least partially, the upper and lower tip portions of the penultimate external turn, respectively.

6. The electrical induction device according to claim 5 wherein said first shaped insulating means comprise a fifth and sixth U-shaped bodies wrapping, at least partially, the upper and lower tip portions of the ante-penultimate external turn, respectively.

7. The electrical induction device according to claim 1 wherein said electrically insulating means comprise second shaped insulating means which are operatively coupled to and arranged around a portion of at least one electrical conducting element which is connected to and protrudes from said at least one inner winding.

8. An electrical induction device for high voltage applications, comprising:

a magnetic core having at least one leg and operatively coupled to a supporting structure;

at least one inner winding which is arranged around said leg and has a first rated voltage;

at least one outer winding which is arranged around said at least one inner winding and has a second rated voltage; and electrically insulating means;

wherein said at least one inner winding comprises a plurality of substantially concentric turns formed by a sheet of electrically conducting material which is spirally wound, and wherein said electrically insulating means comprise at least one layer of electrically insulating material which is arranged between mutually facing surfaces of said concentric turns, and first shaped insulating means which edge, at least partially, at least one of the upper and lower external rims of said at least one inner winding;

wherein said electrically insulating means comprise second shaped insulating means which are operatively coupled to and arranged around a portion of at least one electrical conducting element which is connected to and protrudes from said at least one inner winding; and wherein said second shaped insulating means comprise a first contoured body having a first L-shaped portion which is coupled to said at least one inner winding with a first side positioned substantially parallel to said leg and a second side positioned substantially perpendicular to said leg, and a second U-shaped portion rising from said second side of the L-shaped portion, which surrounds, at least partially, the portion of the conducting element which is connected to the inner winding.

9. The electrical induction device according to claim 8, wherein said second shaped insulating means comprise a second contoured body which is positioned at the upper portion of said at least one inner winding so as to cover a region thereof.

10. The electrical induction device according to claim 9, wherein said second contoured body has an angular sector configuration with an L-shaped side cross-section and is positioned at the upper portion of said at least one inner winding with a first side which is arranged substantially parallel to said leg and covers a portion of the outer surface of the last external turn, and a second side which is positioned substantially perpendicular to said leg and extends up to the most internal turn.

11. The electrical induction device according to claim 7 wherein said supporting structure comprises a plurality of tie rods, and said electrically insulating means comprise third shaped insulating means which are arranged around at least a portion of at least one tie-rod.

12. An electrical induction device for high voltage applications, comprising:

a magnetic core having at least one leg and operatively coupled to a supporting structure;

at least one inner winding which is arranged around said leg and has a first rated voltage;

at least one outer winding which is arranged around said at least one inner winding and has a second rated voltage; and electrically insulating means;

wherein said at least one inner winding comprises a plurality of substantially, concentric turns formed by a sheet of electrically conducting material which is spirally wound, and wherein said electrically insulating means comprise at least one layer of electrically insulating material which is arranged between mutually facing surfaces of said concentric turns, and first shaped insulating means which edge, at least partially, at least one of the upper and lower external rims of said at least one inner winding;

wherein said electrically insulating means comprise second shaped insulating means which are operatively coupled to and arranged around a portion of at least one electrical conducting element which is connected to and protrudes from said at least one inner winding;

wherein said supporting structure comprises a plurality of tie rods, and said electrically insulating means comprise third shaped insulating means which are arranged around at least a portion of at least one tie-rod; and wherein said third shaped insulating means comprise a first and a second layers of cellulose-based material which are tubularly wound around said tie-rod spaced apart from each other, and a third element made of insulating material which is arranged therebetween.

13. The electrical induction device according to claim 12, wherein said first layer comprises a sheet of crepe-paper having a thickness ranging between 0.8 and 1.2 mm which is placed around said tie-rod, said second layer comprise a sheet of crepe-paper having a thickness ranging between 1 and 3 mm which is placed spaced from said first layer so as to define a channel there between, and said third element comprises a contoured body which is positioned inside said channel and mutually spaces out said first and second layers.

14. The electrical induction device according to claim 1 wherein said layer of electrically insulating material comprises two sheets of cellulose-based material mutually attached to each other.

15. The electrical induction device according to claim 1, wherein the first shaped insulating means edge, at least partially, at least one of the upper and lower external rims of said at least one inner winding by covering at least a portion of at least one of the upper and lower external rims that is parallel to the leg and a portion of at least one of the upper and lower external rims that is perpendicular to the leg.

* * * * *